United States Patent
Kuo et al.

(10) Patent No.: US 12,096,697 B2
(45) Date of Patent: Sep. 17, 2024

(54) SEMICONDUCTOR DEVICE INCLUDING MAGNETIC TUNNEL JUNCTION STRUCTURE

(71) Applicant: UNITED MICROELECTRONICS CORP., Hsin-Chu (TW)

(72) Inventors: Chih-Wei Kuo, Tainan (TW); Chia-Chang Hsu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/381,627

(22) Filed: Oct. 18, 2023

(65) Prior Publication Data

US 2024/0049608 A1    Feb. 8, 2024

Related U.S. Application Data

(63) Continuation of application No. 17/705,372, filed on Mar. 27, 2022, now Pat. No. 11,832,527, which is a
(Continued)

(30) Foreign Application Priority Data

May 18, 2021 (CN) .......................... 202110538461.4

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ......... H10N 50/80; H10N 50/01; H10B 61/00
See application file for complete search history.

(56) References Cited

U.S. PATENT DOCUMENTS

2010/0103718 A1* 4/2010 Asao .................. G11C 11/1659
                                                              365/171
2021/0057637 A1* 2/2021 Kuo ....................... H10N 50/01
(Continued)

FOREIGN PATENT DOCUMENTS

EP    764 362 A1    1/2021
EP    790 064 A1    3/2021

OTHER PUBLICATIONS

Kuo, the specification, including the claims, and drawings in the U.S. Appl. No. 16/575,414, filed Sep. 19, 2019.
(Continued)

Primary Examiner — Jami Valentine Miller
(74) Attorney, Agent, or Firm — Winston Hsu (57) ABSTRACT

A semiconductor device includes a substrate, a first MTJ structure, a second MTJ structure, an interconnection structure including a first metal interconnection and a second metal interconnection disposed on and contacting the first metal interconnection, a fifth metal interconnection, and a sixth metal interconnection. The first MTJ structure, the second MTJ structure, and the interconnection structure are disposed on the substrate. The interconnection structure is located between the first MTJ structure and the second MTJ structure in a first horizontal direction. The fifth metal interconnection and the sixth metal interconnection are disposed under and contact the first MTJ structure and the second MTJ structure, respectively. The fifth metal interconnection includes a barrier layer and a metal layer disposed on the barrier layer. A length of the first MTJ structure in the first horizontal direction is greater than a length of the metal layer in the first horizontal direction.

14 Claims, 6 Drawing Sheets

Related U.S. Application Data continuation of application No. 17/341,316, filed on Jun. 7, 2021, now Pat. No. 11,812,667.

(56) References Cited

U.S. PATENT DOCUMENTS

2021/0066579 A1* 3/2021 Wang .................. H10N 50/80
2022/0123200 A1* 4/2022 Lee .................... H10N 50/80

OTHER PUBLICATIONS

Wang, the specification, including the claims, and drawings in the U.S. Appl. No. 16/589,157, filed Oct. 1, 2019.
Hou, the specification, including the claims, and drawings in the U.S. Appl. No. 17/180,876, filed Feb. 22, 2021.

* cited by examiner

FIG. 6

SEMICONDUCTOR DEVICE INCLUDING MAGNETIC TUNNEL JUNCTION STRUCTURE

CROSS REFERENCE TO RELATED APPLICATIONS

This application is a continuation application of U.S. application Ser. No. 17/705,372, filed on Mar. 27, 2022, which is a continuation application of U.S. application Ser. No. 17/341,316, filed on Jun. 7, 2021. The contents of these applications are incorporated herein by reference.

BACKGROUND OF THE INVENTION

1. Field of the Invention

The present invention relates to a semiconductor device, and more particularly, to a semiconductor device including a magnetic tunnel junction (MTJ) structure.

2. Description of the Prior Art

There are essentially two types of data memory devices used in electronic products, non-volatile and volatile memory devices. Magnetic random access memory (MRAM) is a kind of non-volatile memory technology. Unlike current industry-standard memory devices, MRAM uses magnetism instead of electrical charges to store data. In general, MRAM cells include a data layer and a reference layer. The data layer is composed of a magnetic material and the magnetization of the data layer can be switched between two opposing states by an applied magnetic field for storing binary information. The reference layer can be composed of a magnetic material in which the magnetization is pinned so that the strength of the magnetic field applied to the data layer and partially penetrating the reference layer is insufficient for switching the magnetization in the reference layer. During the read operation, the resistance of the MRAM cell is different when the magnetization alignments of the data layer and the reference layer are the same or not, and the magnetization polarity of the data layer can be identified accordingly.

The distance between adjacent MRAM cells is reduced as the density of the memory cell increases. Problems about related manufacturing processes and/or structures may occur when the MRAM cells are disposed too close to one another and have to be improved by design modification accordingly.

SUMMARY OF THE INVENTION

A semiconductor device is provided in the present invention. An interconnection structure is formed with a first metal interconnection and a second metal interconnection on the first metal interconnection and located between two adjacent magnetic tunnel junction structures for improving problems such as a short circuit between the interconnection structure and the magnetic tunnel junction structure when the magnetic tunnel junction structures are disposed too close to each another.

According to an embodiment of the present invention, a semiconductor device is provided. The semiconductor device includes a substrate, a first magnetic tunnel junction (MTJ) structure, a second MTJ structure, an interconnection structure, a third metal interconnection, a fourth metal interconnection, a fifth metal interconnection, and a sixth metal interconnection. The first MTJ structure, the second MTJ structure, and the interconnection structure are disposed on the substrate, and the interconnection structure is located between the first MTJ structure and the second MTJ structure in a first horizontal direction. The first horizontal direction is parallel to a top surface of the substrate. The interconnection structure includes a first metal interconnection and a second metal interconnection. The second metal interconnection is disposed on and contacts the first metal interconnection. The third metal interconnection is disposed on and contacts the first MTJ structure. The fourth metal interconnection is disposed on and contacts the second MTJ structure. The second metal interconnection is elongated in the first horizontal direction, the third metal interconnection and the fourth metal interconnection are elongated in a second horizontal direction, respectively, and the second horizontal direction is parallel to the top surface of the substrate. The fifth metal interconnection is disposed under and contacts the first MTJ structure. The sixth metal interconnection is disposed under and contacts the second MTJ structure. The first metal interconnection is located between the fifth metal interconnection and the sixth metal interconnection in the first horizontal direction. The fifth metal interconnection includes a barrier layer and a metal layer disposed on the barrier layer. A length of the first MTJ structure in the first horizontal direction is greater than a length of the metal layer in the first horizontal direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-6 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
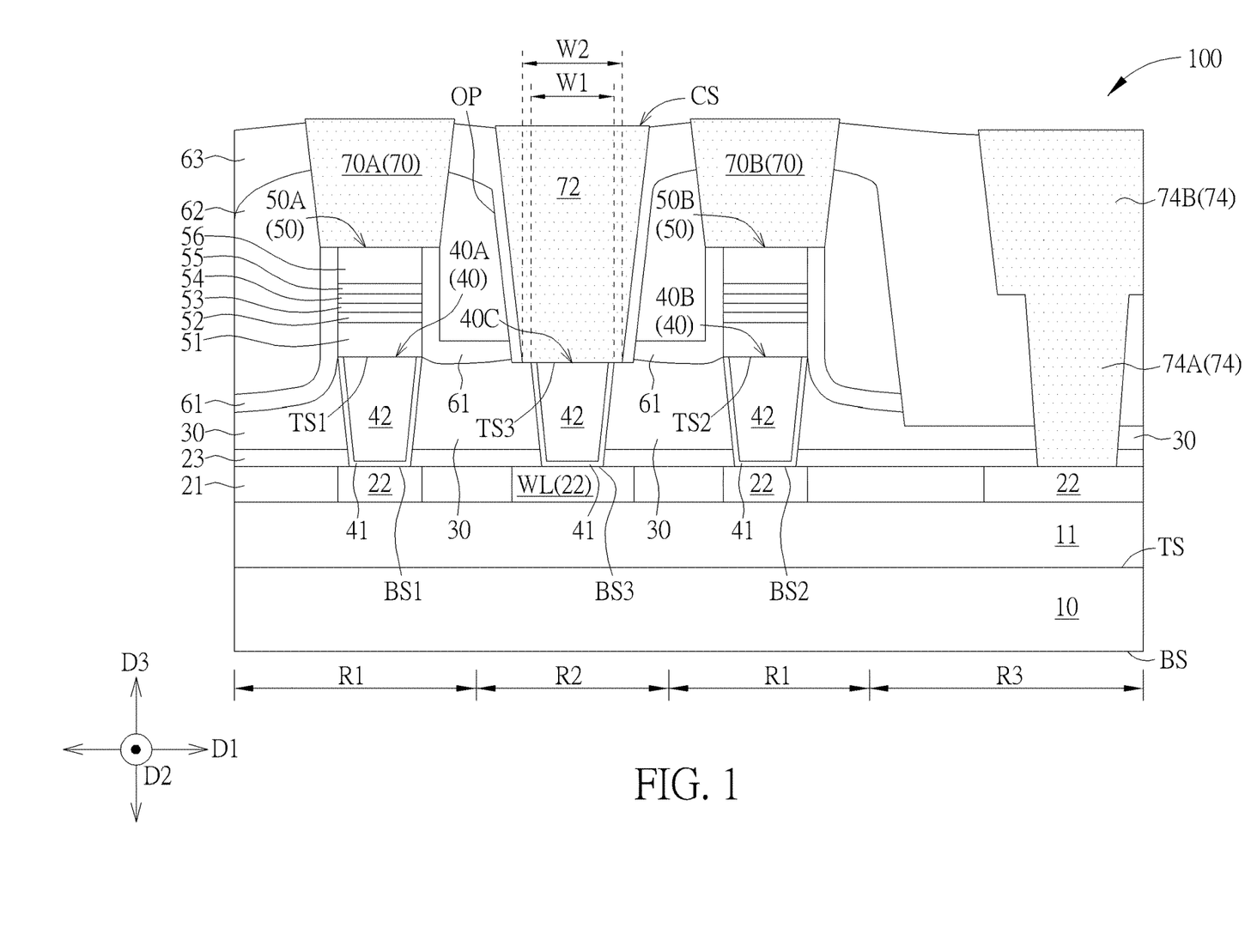
FIG. 1 is a schematic drawing illustrating a semiconductor device according to an embodiment of the present invention.

Please refer to FIG. 1. FIG. 1 is a schematic drawing illustrating a semiconductor device 100 according to an embodiment of the present invention. As shown in FIG. 1, the semiconductor device 100 includes a substrate 10, a first magnetic tunnel junction (MTJ) structure 50A, a second MTJ structure 50B, and an interconnection structure CS. The first MTJ structure 50A, the second MTJ structure 50B, and the interconnection structure CS are disposed on the substrate 10, and the interconnection structure CS is located between the first MTJ structure 50A and the second MTJ structure 50B in a first horizontal direction (such as a first direction D1 shown in FIG. 1). The interconnection structure CS includes a first metal interconnection 40C and a second metal interconnection 72. The second metal interconnection 72 is disposed on and contacts the first metal interconnection 40C. A material composition of the second metal interconnection 72 is different from a material composition of the first metal interconnection 40C. Related manufacturing problems when the interconnection structure between two adjacent MTJ structures is a single metal interconnection, such as a short circuit between the interconnection structure and a metal interconnection disposed corresponding to the MTJ structure, may be improved by the interconnection structure CS formed with the first metal interconnection 40C and the second metal interconnection 72 on the first metal interconnection 40C and formed between two adjacent MTJ structures, and the manufacturing yield may be enhanced accordingly.

In some embodiments, the substrate 10 may have a top surface TS and a bottom surface BS opposite to the top surface TS in a thickness direction of the substrate 10 (such as a third direction D3 shown in FIG. 1), and the first MTJ structure 50A, the second MTJ structure 50B, and the interconnection structure CS described above may be disposed at a side of the top surface TS, but not limited thereto. A horizontal direction substantially orthogonal to the third direction D3 (such as the first direction D1 described above and a second direction D2 shown in FIG. 1) may be substantially parallel with the top surface TS and/or the bottom surface BS of the substrate 10, but not limited thereto. Additionally, in this description, a distance between the bottom surface BS of the substrate 10 and a relatively higher location and/or a relatively higher part in the vertical direction (such as the third direction D3) is greater than a distance between the bottom surface BS of the substrate 10 and a relatively lower location and/or a relatively lower part in the third direction D3. The bottom or a lower portion of each component may be closer to the bottom surface BS of the substrate 10 in the third direction D3 than the top or upper portion of this component. Another component disposed above a specific component may be regarded as being relatively far from the bottom surface BS of the substrate 10 in the third direction D3, and another component disposed under a specific component may be regarded as being relatively closer to the bottom surface BS of the substrate 10 in the third direction D3, but not limited thereto.

Specifically, in some embodiments, the semiconductor device 100 may further include a third metal interconnection 70A, a fourth metal interconnection 70B, a fifth metal interconnection 40A, and a sixth metal interconnection 40B. The third metal interconnection 70A is disposed on and contacts the first MTJ structure 50A, The fourth metal interconnection 70B is disposed on and contacts the second MTJ structure 50B, the fifth metal interconnection 40A is disposed under and contacts the first MTJ structure 50A, and the sixth metal interconnection 40B is disposed under and contacts the second MTJ structure 50B. In other words, the third metal interconnection 70A and the fifth metal interconnection 40A may be disposed above and disposed under the first MTJ structure 50A in the third direction D3, respectively, and directly connected with the first MTJ structure 50A. The fourth metal interconnection 70B and the sixth metal interconnection 40B may be disposed above and disposed under the second MTJ structure 50B in the third direction D3, respectively, and directly connected with the second MTJ structure 50B. In addition, the first metal interconnection 40C in the interconnection structure CS may be disposed between the fifth metal interconnection 40A and the sixth metal interconnection 40B in the first direction D1, and the second metal interconnection 72 in the interconnection structure CS may be disposed between the third metal interconnection 70A and the fourth metal interconnection 70B in the first direction D1.

In some embodiments, the second metal interconnection 72, the third metal interconnection 70A, and the fourth metal interconnection 70B may be formed concurrently by the same manufacturing process, and the material composition of the second metal interconnection 72, the material of the third metal interconnection 70A, and the material of the fourth metal interconnection 70B may be identical to one another accordingly, but not limited thereto. In some embodiments, the first metal interconnection 40C, the fifth metal interconnection 40A, and the sixth metal interconnection 40B may be formed concurrently by the same manufacturing process, and the material composition of the first metal interconnection 40C, the material of the fifth metal interconnection 40A, and the material of the sixth metal interconnection 40B may be identical to one another accordingly, but not limited thereto. In some embodiments, the first metal interconnection 40C, the fifth metal interconnection 40A, and the sixth metal interconnection 40B may be substantially disposed on the same plane. Therefore, a bottom surface BS3 of the first metal interconnection 40C, a bottom surface BS1 of the fifth metal interconnection 40A, and a bottom surface BS2 of the sixth metal interconnection 40B may be substantially coplanar. Additionally, a bottom surface of the second metal interconnection 72 may be lower than a bottom surface of the third metal interconnection 70A and a bottom surface of the fourth metal interconnection 70B in the third direction D3 because there is not any MTJ structure disposed between the first metal interconnection 40C and the second metal interconnection 72 of the interconnection structure CS, and the first metal interconnection 40C and the second metal interconnection 72 of the interconnection structure CS may be directly connected with each other. In some embodiments, an upper portion of the first metal interconnection 40C may be influenced and damaged by manufacturing processes. Therefore, and a top surface TS3 of the first metal interconnection 40C and the bottom surface of the second metal interconnection 72 may be slightly lower than a top surface TS1 of the fifth metal interconnection 40A and a top surface TS2 of the sixth metal interconnection 40B in the first direction D1, but not limited thereto. Additionally, in some embodiments, a bottom width of the second metal interconnection 72 (such as a width W2 shown in FIG. 1) may be greater than a top width of the first metal interconnection 40C (such as a width W1 shown in FIG. 1) for reducing negative influence of alignment shifting generated by process variations on the electrical connection between the second metal interconnection 72 and the first metal interconnection 40C, but not limited thereto.

In some embodiments, the first metal interconnection 40C, the fifth metal interconnection 40A, and the sixth metal interconnection 40B may be respectively regarded as a via conductor mainly elongated in the vertical direction (such as the third direction D3), and the second metal interconnection 72, the third metal interconnection 70A, and the fourth metal interconnection 70B may be respectively regarded as a trench conductor mainly elongated in a horizontal direction. In some embodiments, the first metal interconnection 40C, the fifth metal interconnection 40A, and the sixth metal interconnection 40B may respectively include a barrier layer 41 and a metal layer 42, but not limited thereto. The barrier layer 41 may include titanium (Ti), titanium nitride (TiN), or other suitable barrier materials, and the metal layer 42 may include tungsten (W), aluminum (Al), titanium aluminide (TiAl), or other suitable metallic materials. In some embodiments, the second metal interconnection 72, the third metal interconnection 70A, and the fourth metal interconnection 70B may respectively include a barrier layer (not shown) and a metal layer (not shown) disposed on the barrier layer also. The metal layers in the second metal interconnection 72, the third metal interconnection 70A, and the fourth metal interconnection 70B may be a metallic material with low electrical resistivity and diffusion concern (such as copper) because the third metal interconnection 70A and the fourth metal interconnection 70B are disposed on the MTJ structure respectively and the barrier layer may be used to avoid the negative influence of the diffusion of the metal layer on the MTJ structure, but not limited thereto. Comparatively, it is not suitable to form the metal layer 42 with copper because the metal layers 42 in the fifth metal interconnection 40A and the sixth metal interconnection 40B directly contact the MTJ structure, and the material composition of the second metal interconnection 72 may be different from the material composition of the first metal interconnection 40C accordingly. For example, the metal layer 42 described above may be a tungsten layer and the corresponding barrier layer 41 may be titanium, titanium nitride, and/or a stacked layer of titanium and titanium nitride. The metal layer in the second metal interconnection 72 may be copper, and the corresponding barrier layer may be tantalum nitride (TaN) or other suitable barrier materials.

In some embodiments, the substrate 10 may include a semiconductor substrate or a non-semiconductor substrate. The semiconductor substrate may include a silicon substrate, a silicon germanium semiconductor substrate or a silicon-on-insulator (SOI) substrate, and the non-semiconductor substrate may include a glass substrate, a plastic substrate, or a ceramic substrate, but not limited thereto. For example, when the substrate 10 includes a semiconductor substrate, a plurality of silicon-based field effect transistors (not shown), a dielectric layer (such as a dielectric layer 11 and a dielectric layer 21 shown in FIG. 1) covering the silicon-based field effect transistors, and metal interconnections 22 may be formed on the semiconductor substrate before the step of forming the first metal interconnection 40C, the fifth metal interconnection 40A, and the sixth metal interconnection 40B described above. In some embodiments, the first metal interconnection 40C, the fifth metal interconnection 40A, and the sixth metal interconnection 40B may be electrically connected with some of the metal interconnections 22, and the first metal interconnection 40C, the fifth metal interconnection 40A, and the sixth metal interconnection 40B may be electrically connected downward to the silicon-based field effect transistor described above via some of the metal interconnections 22, but not limited thereto. In some embodiments, each of the metal interconnections 22 may be regarded as a trench conductor mainly elongated in a horizontal direction. Additionally, in some embodiments, the substrate 10 may include a first region R1 and a second region R2. The first region R1 may be regarded as a memory cell region with MTJ structures formed thereon, the second region R2 located between two adjacent first region R1 may be regarded as a region corresponding to word lines, and the metal interconnection 22 disposed on the second region R2 and electrically connected with the first metal interconnection 40C may include a word line WL accordingly, but not limited thereto.

In some embodiments, the semiconductor device 100 may further include a stop layer 23, a first inter-metal dielectric (IMD) layer 30, a cap layer 61, a second IMD layer 62, an ultra-low dielectric constant (ULK) dielectric layer 63, and an opening OP. The first IMD layer 30 may be disposed on the substrate 10 and located on the dielectric layer 21. The stop layer 23 may be disposed between the first IMD layer 30 and the dielectric layer 21. The cap layer 61 may be disposed on the first MTJ structure 50A, the second MTJ structure 50B, and the first IMD layer 30, and the second IMD layer 62 may be disposed on the cap layer 61. The opening OP may be located above the first metal interconnection 40C and penetrate through the second IMD layer 62 and the cap layer 61 in the third direction D3, and the second metal interconnection 72 may be disposed in the opening OP. In some embodiments, the ULK dielectric layer 63 may be disposed on the second IMD layer 62 and disposed in the opening OP, and at least a part of the ULK dielectric layer 63 may be located between the second metal interconnection 72 and the second IMD layer 62 in the first direction D1, but not limited thereto. In some embodiments, the first IMD layer 30 and the stop layer 23 may surround the first metal interconnection 40C, the fifth metal interconnection and the sixth metal interconnection 40C in the horizontal direction; the cap layer 61 may be located on sidewalls of the first MTJ structure 50A and sidewalls of the second MTJ structure 50B; and the second IMD layer 62 may surround a part of the third metal interconnection 70A and a part of the fourth metal interconnection 70B in the horizontal direction, but not limited thereto.

In some embodiments, the second metal interconnection 72 may penetrate through the ULK dielectric layer 63 located in the opening OP in the third direction D3, the third metal interconnection 70A may penetrate through the second IMD layer 62 and the ULK dielectric layer 63 on the first MTJ structure 50A in the third direction D3, and the fourth metal interconnection may penetrate through the second IMD layer 62 and the ULK dielectric layer 63 on the second MTJ structure 50B in the third direction D3. Additionally, in some embodiments, the substrate 10 may further include a third region R3, the semiconductor device 100 may further include a metal interconnection 74 disposed on the third region R3 and electrically connected with the metal interconnection 22 on the third region R3, and the third region R3 may be regarded as a logic region, but not limited thereto. In some embodiments, the metal interconnection 74 may include a via conductor 74A and a trench conductor 74B connected with the via conductor 74A for forming a dual damascene structure, but not limited thereto. In some embodiments, the metal interconnection 74 may be formed on the third region R3 with a single damascene structure or other suitable structures according to other design considerations.

In some embodiments, the structure of the metal interconnection 22 may be similar to that of the second metal interconnection 72 and include a barrier layer (not shown) and a metal layer (not shown), but not limited thereto. In some embodiments, the dielectric layer 11, the dielectric layer 21, the first IMD layer 30 and the second IMD layer 62 may respectively include silicon oxide, a low dielectric constant (low-k) dielectric material, or other suitable dielectric materials. The ULK dielectric layer 63 may include a dielectric material with a dielectric constant lower than 2.7, such as benzocyciclobutene (BCB), hydrogen silsesquioxane (HSQ), methyl silesquioxane (MSQ), hydrogenated silicon oxycarbide (SiOC-H), a porous dielectric material, or other suitable dielectric materials. The stop layer 23 may include nitrogen doped carbide (NDC), silicon nitride, silicon carbon-nitride (SiCN), or other suitable insulation materials. The cap layer 61 may include silicon nitride or other dielectric material different from the first IMD layer 30 and the second IMD layer 62, and the cap layer 61 may be used as an etching stop layer accordingly, but not limited thereto.

In some embodiments, the semiconductor device 100 may include a plurality of metal interconnections 40, a plurality of MTJ structures 50, and a plurality of metal interconnections 70. Each of the MTJ structures 50 may be disposed corresponding to and electrically connected with one of the metal interconnections 40 and one of the metal interconnections 70. Two of the MTJ structures 50 adjacent to each other may be regarded as the first MTJ structure 50A and the second MTJ structure 50B described above, two of the metal interconnections 40 may be respectively regarded as the fifth metal interconnection 40A and the sixth metal interconnection 40B described above, and two of the metal interconnections 70 may be respectively regarded as the third metal interconnection 70A and the fourth metal interconnection 70B described above.

In some embodiments, each of the MTJ structures 50 may include a first electrode 51, a pinned layer 52, a first barrier layer 53, a free layer 54, a second barrier layer 55, and a second electrode 56 disposed sequentially stacked in the third direction D3, but not limited thereto. In some embodiments, the MTJ structure 50 may include a stacked structure different from the materials layers described above and/or include other material layers. In some embodiments, the first electrode 51 and the second electrode 56 may include metallic materials, such as tantalum (Ta), platinum (Pt), ruthenium (Ru), a stack layer of the above-mentioned materials, an alloy of the above-mentioned materials, or other suitable conductive materials. The pinned layer 52 may include an antiferromagnetic layer and a reference layer. The antiferromagnetic layer may include antiferromagnetic materials such as iron manganese (FeMn), platinum manganese (PtMn), iridium manganese (IrMn), nickel oxide (NiO), a cobalt/platinum (Co/Pt) multilayer, or other suitable antiferromagnetic materials. The free layer 54 and the reference layer in the pinned layer 52 may include ferromagnetic materials such as iron, cobalt, nickel, cobalt-iron (CoFe), cobalt-iron-boron (CoFeB), or other suitable ferromagnetic materials. The first barrier layer 53 and the second barrier layer 55 may include insulation materials such as magnesium oxide (MgO), aluminum oxide, or other suitable insulation materials. The above-mentioned material layers in the MTJ structure 50 may be formed by deposition processes, such as sputtering processes, but not limited thereto.

Figure 2:
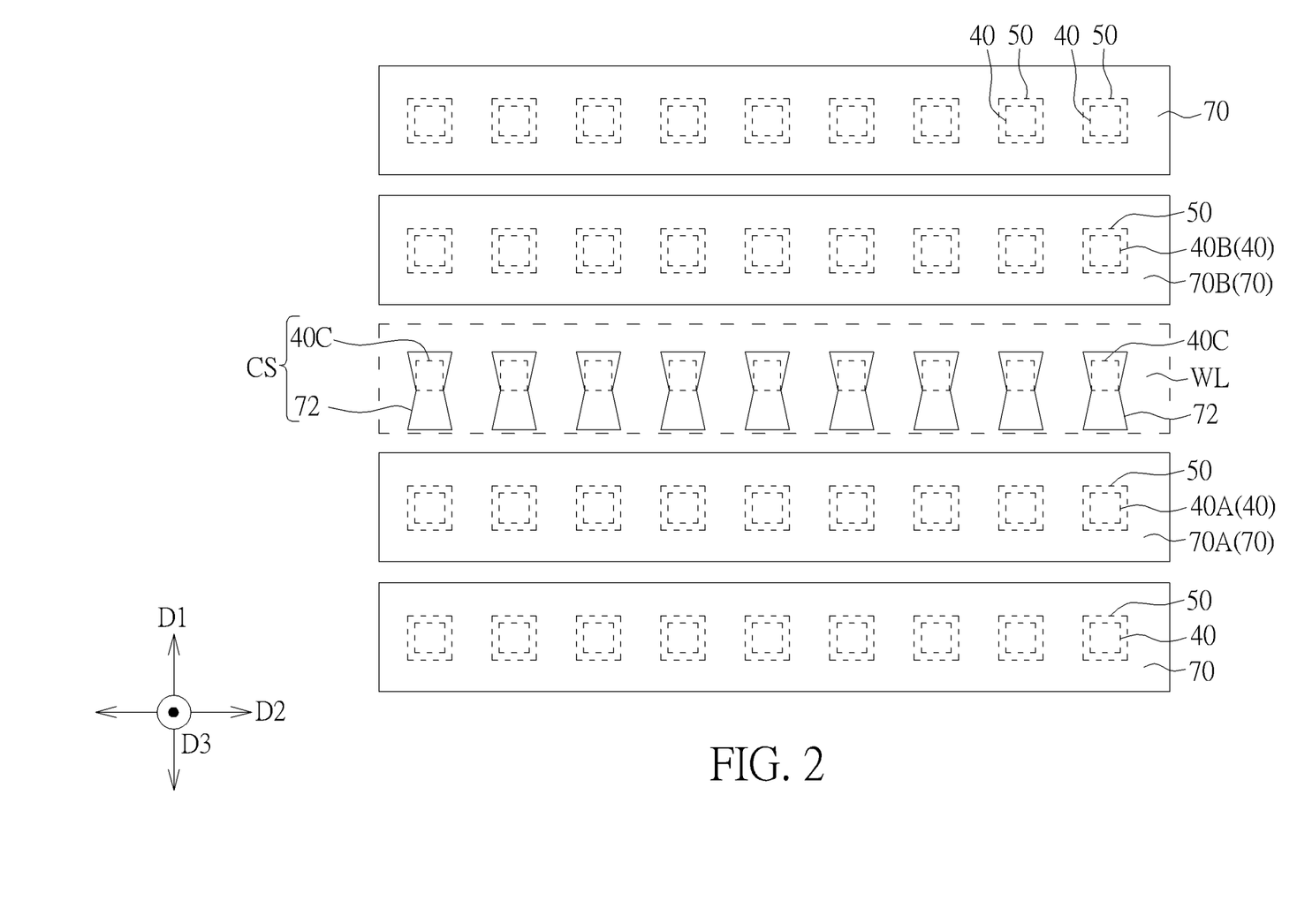
FIG. 2 is a schematic drawing illustrating a top view of a semiconductor device according to an embodiment of the present invention.

Please refer to FIG. 1 and FIG. 2. FIG. 2 is a schematic drawing illustrating a top view of a semiconductor device according to an embodiment of the present invention. In some embodiments, FIG. 2 may be regarded as a schematic drawing illustrating a top view of the first region R1 and the second region R2 shown in FIG. 1 without illustrating the third region R3, but not limited thereto. As shown in FIG. 1 and FIG. 2, in some embodiments, the second metal interconnection 72 may be elongated in the first horizontal direction (such as the first direction D1), the third metal interconnection 70A and the fourth metal interconnection 70B may be elongated in a second horizontal direction (such as the second direction D2), respectively, and the first direction D1 and the second direction D2 orthogonal substantially, but not limited thereto. In some embodiments, the word line WL may be elongated in the second direction D2 and disposed parallel with the metal interconnection 70, and the word line WL may be disposed corresponding to a plurality of the interconnection structures CS for avoiding the negative influence of a single second metal interconnection 72 with greater area and depth on the adjacent metal interconnections 70 and/or the MTJ structures 50, such as the loading effect of an etching process for forming the corresponding trench, but not limited thereto. Therefore, the elongation direction of the second metal interconnection 72 in the interconnection structure CS may be different from the elongation direction of the metal interconnection 70. In some embodiments, a length of the second metal interconnection 72 in the first direction D1 is greater than a length of the second metal interconnection 72 in the second direction D2, and a length of the metal interconnection 70 in the second direction D2 is greater than a length of the metal interconnection 70 in the first direction D1. Additionally, in some embodiments, a length of the first metal interconnection 40C in the first direction D1 may be less than the length of the second metal interconnection 72 in the first direction D1, and the length of the first metal interconnection 40C in the first direction D1 may be substantially equal to a length of the first metal interconnection 40C in the second direction D2, but not limited thereto.

Figure 3:
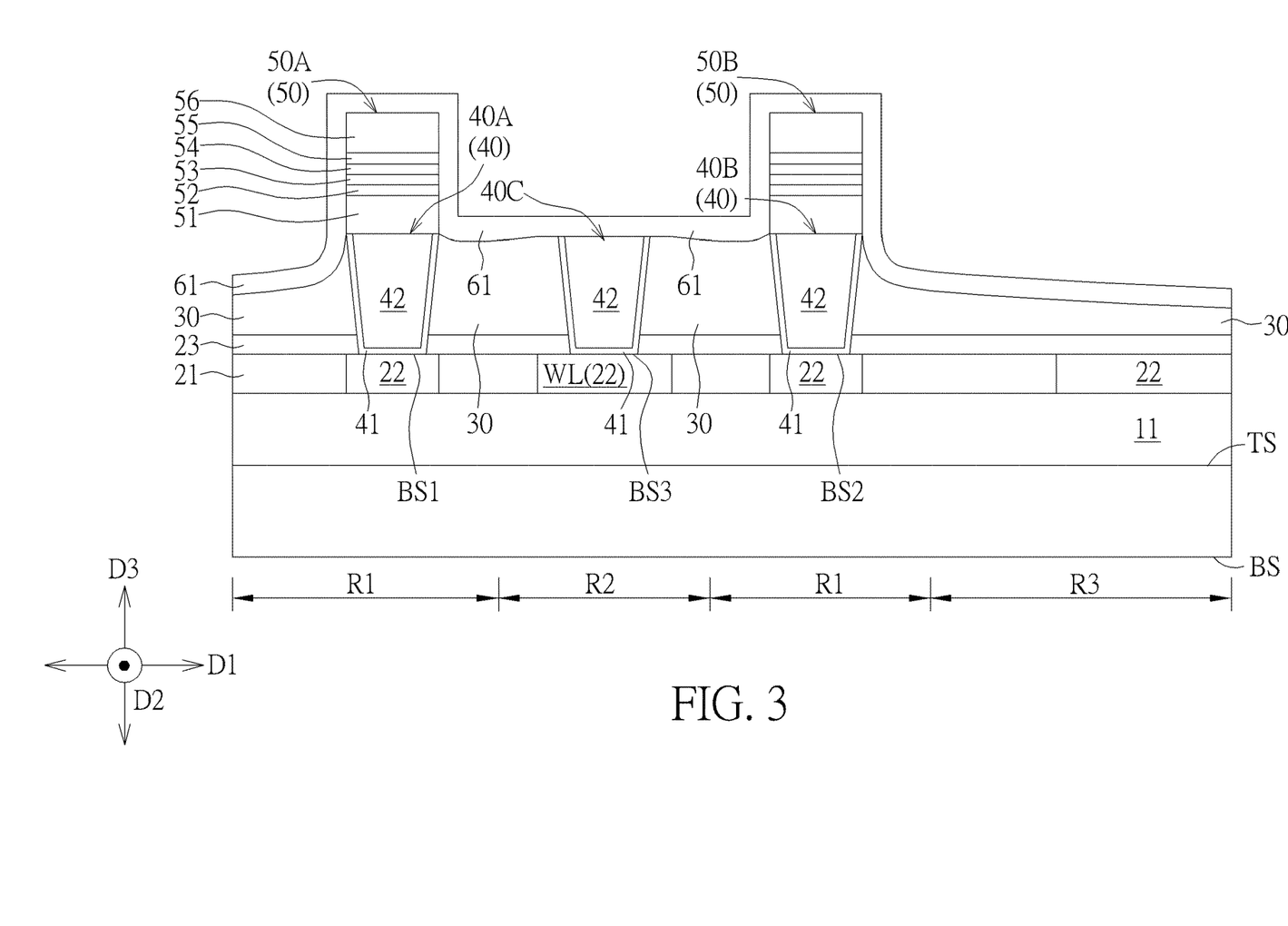
Figure 4:
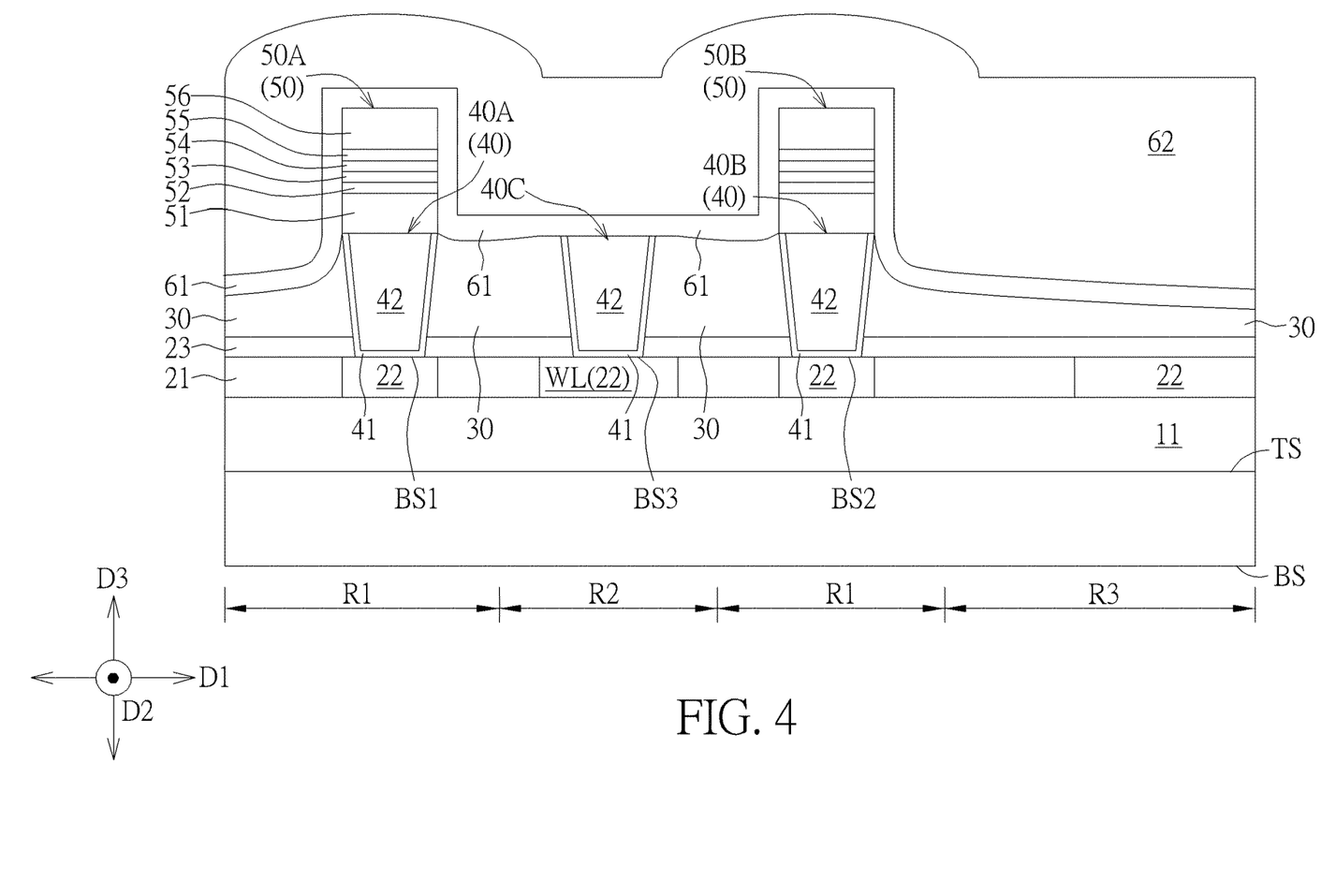
Figure 5:
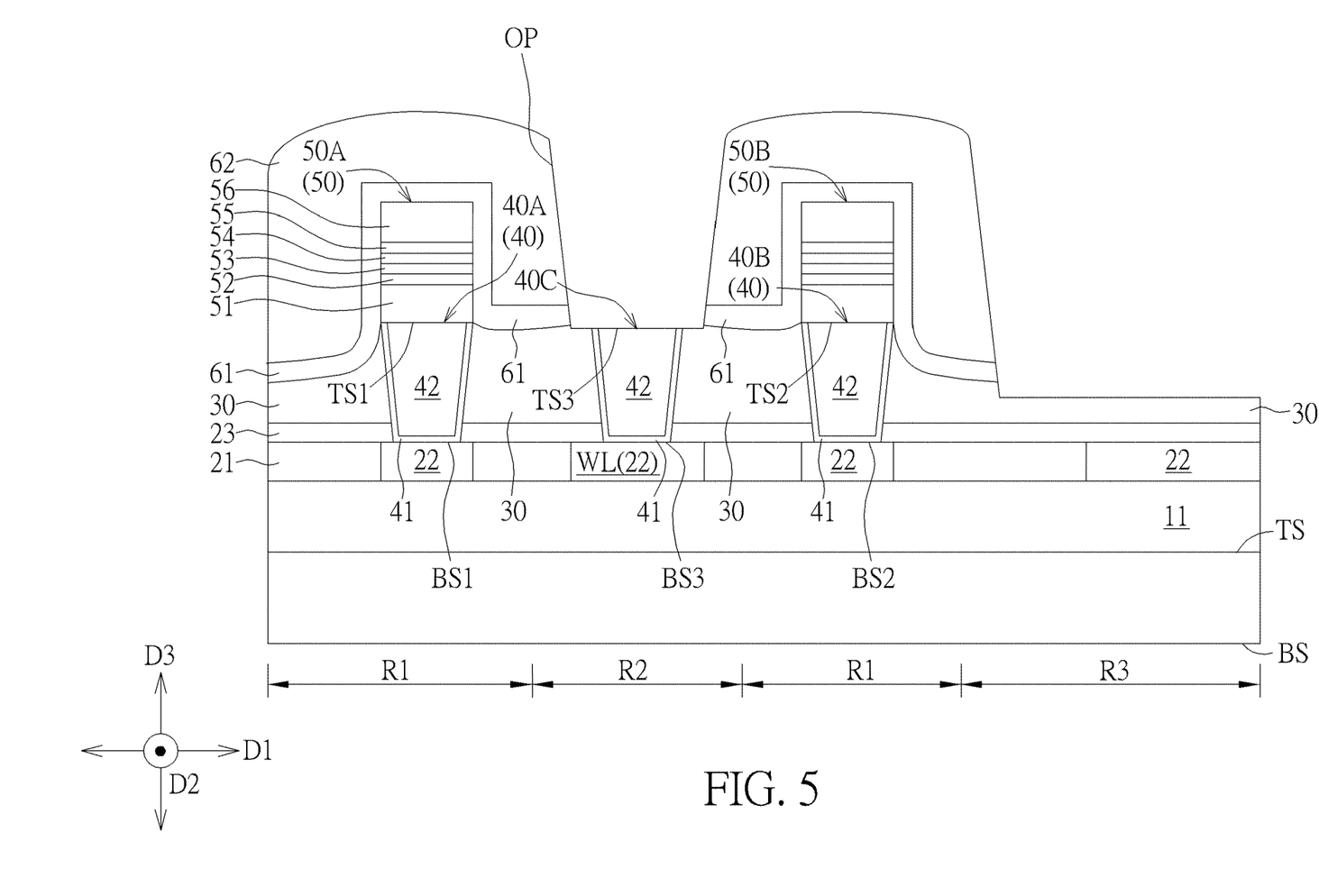
Figure 6:
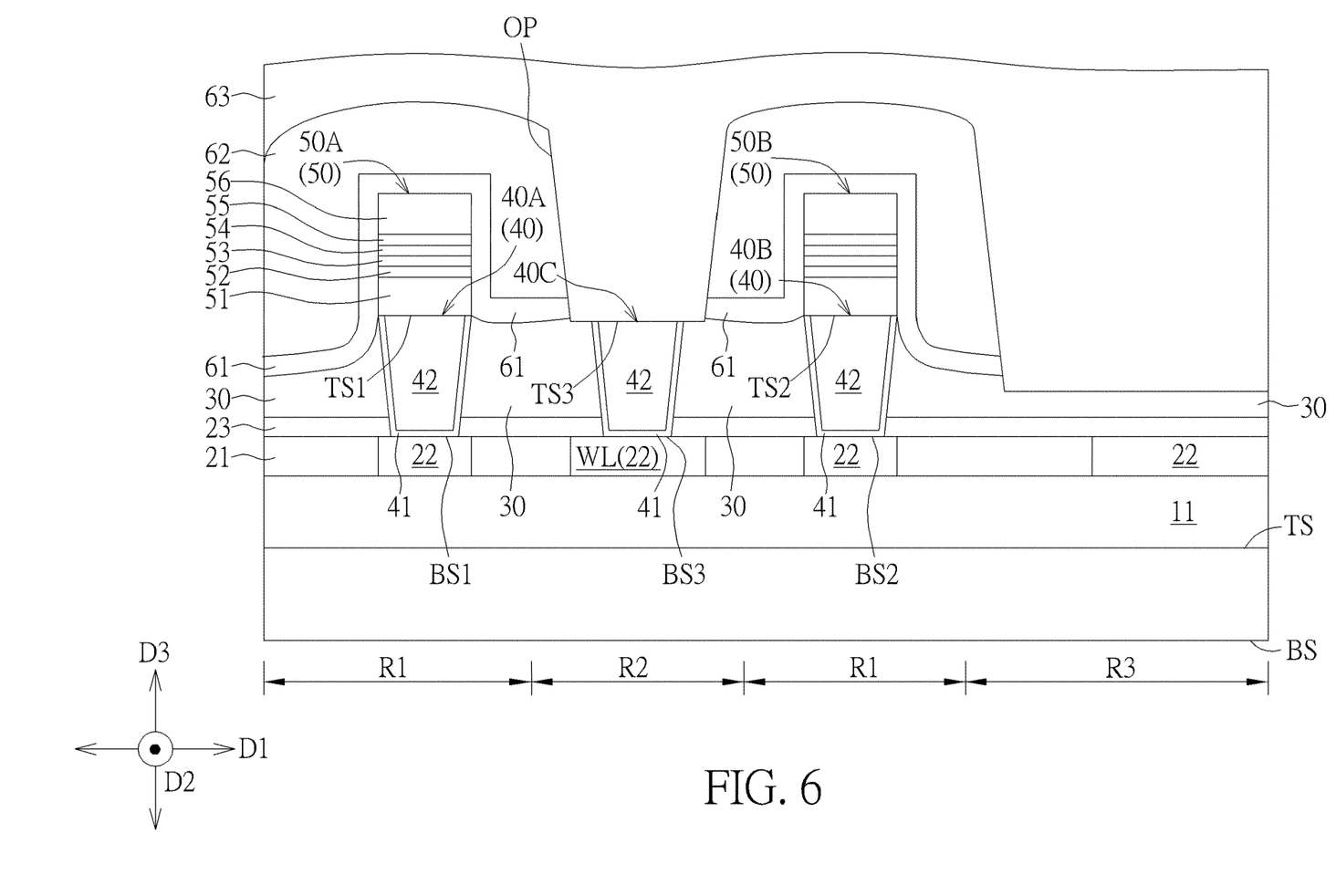

Please refer to FIGS. 3-6 and FIG. 1. FIGS. 3-6 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 1 may be regarded as a schematic drawing in a step subsequent to FIG. 6, but not limited thereto. As shown in FIG. 1, the manufacturing method of the semiconductor device 100 in this embodiment may include the following steps. The first MTJ structure 50A, the second MTJ structure 50B, and the interconnection structure CS are formed on the substrate 10. The interconnection structure CS is located between the first MTJ structure 50A and the second MTJ structure 50B in the first direction D1. The interconnection structure CS includes the first metal interconnection 40C and the second metal interconnection 72. The second metal interconnection 72 is disposed on and contacts the first metal interconnection 40C. The material composition of the second metal interconnection 72 is different from the material composition of the first metal interconnection 40C. In addition, the third metal interconnection 70A and the fourth metal interconnection 70B may be formed on the substrate 10. The third metal interconnection 70A is disposed on and contacts the first MTJ structure 50A, and the fourth metal interconnection 70B is disposed on and contacts the second MTJ structure 50B. The second metal interconnection 72 is elongated in the first direction D1, and the third metal interconnection 70A and the fourth metal interconnection 70B are elongated in the second direction D2, respectively.

Specifically, the manufacturing method of the semiconductor device in this embodiment may include but is not limited to the following steps. Firstly, as shown in FIG. 3, the dielectric layer 11, the dielectric layer 21, the metal interconnections 22, the stop layer 23, the first IMD dielectric layer 30, the metal interconnections 40, the first metal interconnection 40C, the MTJ structures 50, and the cap layer 61 are formed on the substrate 10. In some embodiments, the MTJ structures 50 may be formed by performing an etching process for patterning material layers required in the MTJ structure 50, and the etching process may include reactive ion etching (RIE) process and/or ion beam etching (IBE) process, but not limited thereto. Because of the characteristics of the IBE process, a part of the first IMD layer 30 may be removed by the process of forming the MTJ structures 50, and a top surface of the remaining part of the first IMD layer 30 may include a recess surface, such as a concave curved surface. In some embodiments, the first metal interconnection 40C, the fifth metal interconnection 40A, and the sixth metal interconnection 40B may be formed with same material and formed concurrently by the same process. The first IMD layer 30 located between the fifth metal interconnection 40A and the sixth metal interconnection 40B may be influenced by the first metal interconnection 40C and has a relatively higher top surface, and the top surface of the first IMD layer 30 located between the fifth metal interconnection 40A and the sixth metal interconnection 40B may be higher than the concave surface of the first IMD layer 30 on other regions (such as the first IMD layer 30 on the third region R3), but not limited thereto. In addition, the cap layer 61 may be formed conformally on the first IMD layer 30, the MTJ structures 50, and the first metal interconnection 40C.

Subsequently, as shown in FIG. 4, the second IMD layer 62 may be formed on the cap layer 61. In some embodiments, an etching back process may be performed to the second IMD layer 62 for reducing the thickness of the second IMD layer 62, but not limited thereto. As shown in FIG. 5, a part of the second IMD layer 62 and a part of the cap layer 61 may be then removed for forming the opening OP, and the opening OP exposes the first metal interconnection 40C. In some embodiments, a part of the first metal interconnection 40C may be removed by the process of forming the opening OP (such as an etching process), and the top surface TS3 of the first metal interconnection 40C may be slightly lower than the top surface TS1 of the fifth metal interconnection 40A and the top surface TS2 of the sixth metal interconnection 40B in the third direction D3 accordingly. Additionally, the second IMD layer 62 and the cap layer 61 on the third region R3 may be removed for exposing the first IMD layer 30 on the third region R3. Subsequently, as shown in FIG. 6, the ULK dielectric layer 63 may be formed, and the ULK dielectric layer 63 may be formed in the opening OP, on the second IMD layer 62, and on the first IMD layer 30 above the third region R3.

In some embodiments, an etching back process may be performed to the ULK dielectric layer 63 for reducing the thickness of the ULK dielectric layer 63, but not limited thereto. In addition, because of the influence of the MTJ structures 50, it is difficult to form the ULK dielectric layer 63 with a flat surface. However, compared to the situation where the first metal interconnection 40C is not formed, the surface height difference of the ULK dielectric layer 63 may be improved by the arrangement of the first metal interconnection 40C. For example, in the situation where the first metal interconnection 40C is not formed, the bottom surface of the opening corresponding to the second region R2 and the surface of the first IMD layer 30 above the third region R3 will be located at nearly the same level in the third direction D3, and the ULK dielectric layer 63 subsequently formed will be influenced and may be formed with a greater surface height difference.

As shown in FIG. 6 an FIG. 1, the metal interconnections 70, the second metal interconnection 72, and the metal interconnection 74 may be formed. In some embodiments, the metal interconnections 70, the second metal interconnection 72, and the metal interconnection 74 may be formed with the same material and formed concurrently by the same process, but not limited thereto. For example, trenches corresponding to the second metal interconnection 72, the third metal interconnection 70A, and the fourth metal interconnection 70B, such as a trench penetrating through the ULK dielectric layer 63 on the first metal interconnection 40C and trenches penetrating through the ULK dielectric layer 63, the second IMD layer 62, and the cap layer 61 on the MTJ structures 50, may be formed firstly. The trenches described above may then be filled with the corresponding metallic material, and a chemical mechanical polishing process may be performed to the metallic material for removing a part of the metallic material and forming the second metal interconnection 72, the third metal interconnection 70A, and the fourth metal interconnection 70B. In the chemical mechanical polishing process described above, the surface flatness of the ULK dielectric layer 63 will affect the progress of the chemical mechanical polishing process. For example, the metallic material may remain on the ULK dielectric layer 63 when the surface height difference of the ULK dielectric layer 63 is too large, and the remaining metallic material on the ULK dielectric layer 63 may electrically connect the second metal interconnection 72 and the metal interconnection 70 that need to be electrically separated from each other in design. Therefore, the surface height difference of the ULK dielectric layer 63 may be reduced by the interconnection structure CS formed with the first metal interconnection 40C and the second metal interconnection 72 between two MTJ structures 50, and the manufacturing yield of the semiconductor device may be improved accordingly.

To summarize the above descriptions, in the semiconductor device according to the present invention, the interconnection structure is formed with the first metal interconnection and the second metal interconnection and located between two adjacent magnetic tunnel junction structures for improving problems such as a short circuit between the interconnection structure and the magnetic tunnel junction structure when the magnetic tunnel junction structures are disposed too close to each another. Accordingly, the manufacturing yield of the semiconductor device may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first magnetic tunnel junction (MTJ) structure disposed on the substrate;
   a second MTJ structure disposed on the substrate;
   an interconnection structure disposed on the substrate and located between the first MTJ structure and the second MTJ structure in a first horizontal direction, wherein the first horizontal direction is parallel to a top surface of the substrate, and the interconnection structure comprises:
      a first metal interconnection; and
      a second metal interconnection disposed on and contacting the first metal interconnection;
   a third metal interconnection disposed on and contacting the first MTJ structure;
   a fourth metal interconnection disposed on and contacting the second MTJ structure, wherein the second metal interconnection is elongated in the first horizontal direction, the third metal interconnection and the fourth metal interconnection are elongated in a second horizontal direction, respectively, and the second horizontal direction is parallel to the top surface of the substrate;
   a fifth metal interconnection disposed under and contacting the first MTJ structure; and
   a sixth metal interconnection disposed under and contacting the second MTJ structure, wherein the first metal interconnection is located between the fifth metal interconnection and the sixth metal interconnection in the first horizontal direction, the fifth metal interconnection comprises a barrier layer and a metal layer disposed on the barrier layer, and a length of the first MTJ structure in the first horizontal direction is greater than a length of the metal layer in the first horizontal direction.

2. The semiconductor device according to claim 1, wherein a material composition of the second metal interconnection, a material composition of the third metal interconnection, and a material composition of the fourth metal interconnection are identical to one another.

3. The semiconductor device according to claim 1, wherein in a top view of the semiconductor device, a width of each of two end portions of the second metal interconnection in the first horizontal direction is greater than a width of a middle portion of the second metal interconnection located between the two end portions of the second metal interconnection.

4. The semiconductor device according to claim 1, wherein a length of the third metal interconnection in the second horizontal direction is greater than a length of the third metal interconnection in the first horizontal direction.

5. The semiconductor device according to claim 1, wherein a length of the third metal interconnection in the first horizontal direction is greater than the length of the first MTJ structure in the first horizontal direction.

6. The semiconductor device according to claim 1, wherein a length of the third metal interconnection in the second horizontal direction is greater than a length of the first MTJ structure in the second horizontal direction.

7. The semiconductor device according to claim 1, wherein a length of the second metal interconnection in the first horizontal direction is greater than a length of the second metal interconnection in the second horizontal direction.

8. The semiconductor device according to claim 1, wherein the first horizontal direction and the second horizontal direction are orthogonal.

9. The semiconductor device according to claim 1, wherein a length of the first MTJ structure in the second horizontal direction is greater than a length of the metal layer in the second horizontal direction.

10. The semiconductor device according to claim 1, wherein a bottom surface of the first metal interconnection, a bottom surface of the fifth metal interconnection, and a bottom surface of the sixth metal interconnection are coplanar.

11. The semiconductor device according to claim 1, wherein a top surface of the first metal interconnection is lower than a top surface of the fifth metal interconnection and a top surface of the sixth metal interconnection in a thickness direction of the substrate.

12. The semiconductor device according to claim 1, wherein the material composition of the first metal interconnection is identical to a material composition of the fifth metal interconnection and a material composition of the sixth metal interconnection.

13. The semiconductor device according to claim 1, further comprising:
   a first inter-metal dielectric (IMD) layer disposed on the substrate, wherein the first IMD layer surrounds the first metal interconnection;
   a cap layer disposed on the first MTJ structure, the second MTJ structure, and the first IMD layer;
   a second IMD layer disposed on the cap layer; and
   an opening located above the first metal interconnection and penetrating through the second IMD layer and the cap layer, wherein the second metal interconnection is disposed in the opening.

14. The semiconductor device according to claim 13, further comprising:
   an ultra-low dielectric constant (ULK) dielectric layer disposed on the second IMD layer and disposed in the opening, wherein at least a part of the ULK dielectric layer is located between the second metal interconnection and the second IMD layer in the first horizontal direction.

* * * * *